United States Patent
Marroquin et al.

(10) Patent No.: US 11,778,789 B2
(45) Date of Patent: Oct. 3, 2023

(54) CONSTANT TEMPERATURE CLOSED-LOOP AIRFLOW CONTAINMENT

(71) Applicant: International Business Machines Corporation, Armonk, NY (US)

(72) Inventors: Christopher M. Marroquin, Rochester, MN (US); Ray Clement Laning, Paynesville, MN (US); Brandon R. Christenson, Kasson, MN (US); Milnes P. David, New Paltz, NY (US); Phillip V. Mann, Rochester, MN (US); Michael S. Gordon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 17/340,328

(22) Filed: Jun. 7, 2021

(65) Prior Publication Data
US 2022/0394886 A1 Dec. 8, 2022

(51) Int. Cl.
H05K 7/20 (2006.01)

(52) U.S. Cl.
CPC ..... *H05K 7/20763* (2013.01); *H05K 7/20145* (2013.01); *H05K 7/20172* (2013.01); *H05K 7/20718* (2013.01)

(58) Field of Classification Search
CPC ........... H05K 7/20763; H05K 7/20145; H05K 7/20172; H05K 7/20281; H05K 7/20718
See application file for complete search history.

(56) References Cited

U.S. PATENT DOCUMENTS

| | | | |
|---|---|---|---|
| 4,541,792 A * | 9/1985 | Zakic | B29C 48/832 425/379.1 |
| 5,718,628 A | 2/1998 | Nakazato | |
| 7,286,351 B2 | 10/2007 | Campbell et al. | |
| 7,342,789 B2 | 3/2008 | Hall et al. | |
| 9,606,588 B2 | 3/2017 | Dean et al. | |
| 9,618,270 B2 | 4/2017 | Chapel et al. | |
| 9,622,379 B1 * | 4/2017 | Campbell | H05K 7/20318 |
| 10,617,042 B2 | 4/2020 | Shelnutt et al. | |
| 2005/0061541 A1 * | 3/2005 | Belady | G06F 1/20 174/252 |

(Continued)

OTHER PUBLICATIONS

Conteg, "Modular Closed Loop," https://www.conteg.com/efficient-closed-solutions#tabsul, retrieved Feb. 25, 2021, 2 pgs.

*Primary Examiner* — Abhishek M Rathod
(74) *Attorney, Agent, or Firm* — Kelsey M. Skodje

(57) ABSTRACT

A system, an article of manufacture, and a method are disclosed. The system includes a set of components in an enclosure. The set of components includes electronic devices and airflow moving components configured to maintain airflow across the electronic devices from a front plenum of the enclosure to a rear plenum of the enclosure and direct air from the rear plenum through the first heat exchanger. The set of components also includes a first heat exchanger configured to circulate a cooling liquid and a second heat exchanger configured to maintain a constant temperature of the cooling liquid, wherein the constant temperature is a temperature of the cooling liquid within a threshold distance from a selected temperature.

20 Claims, 2 Drawing Sheets

(56) References Cited

U.S. PATENT DOCUMENTS

| | | | |
|---|---|---|---|
| 2009/0268404 A1* | 10/2009 | Chu | H05K 7/20745 |
| | | | 361/698 |
| 2011/0100618 A1 | 5/2011 | Carlson | |
| 2013/0021746 A1* | 1/2013 | Campbell | H05K 7/20827 |
| | | | 165/104.13 |
| 2013/0081778 A1 | 4/2013 | Good et al. | |
| 2013/0107453 A1* | 5/2013 | Chainer | H05K 7/20827 |
| | | | 165/104.34 |
| 2013/0138253 A1* | 5/2013 | Chainer | H05K 7/20836 |
| | | | 700/282 |
| 2017/0013746 A1* | 1/2017 | Campbell | H05K 7/20736 |
| 2017/0045300 A1* | 2/2017 | Boday | H05K 7/20254 |
| 2019/0128271 A1* | 5/2019 | Campbell | F04D 29/20 |
| 2021/0126304 A1* | 4/2021 | Shao | H01M 10/627 |
| 2022/0201902 A1* | 6/2022 | Shaw | H05K 7/20745 |
| 2022/0236779 A1* | 7/2022 | Heydari | G06F 1/206 |

\* cited by examiner

CONSTANT TEMPERATURE CLOSED-LOOP AIRFLOW CONTAINMENT

BACKGROUND

The present disclosure relates to information handling systems and, more specifically, to closed-loop cooling of electronic enclosures.

Electronic devices, such as rack-mounted electronic devices, generate heat. Heat can cause damage to electronic equipment even when operating within established parameters. This can lead to reduced performance or failure of the electronic equipment. Therefore, cooling systems are used to remove heat dissipated during operation of electronic equipment/devices (e.g., computer servers). Closed-loop cooling systems can be used to protect equipment from temperature increases or fluctuations in the surrounding environment. In a closed-loop cooling system, electronic equipment is kept in a sealed enclosure that circulates air, which is cooled (e.g., by a heat exchanger) after absorbing heat from the electronics. The air is then recirculated through the enclosure to absorb newly generated heat.

SUMMARY

Various embodiments are directed to a system that includes a set of components in an enclosure. The set of components includes electronic devices and airflow moving components configured to maintain airflow across the electronic devices from a front plenum of the enclosure to a rear plenum of the enclosure and direct air from the rear plenum through the first heat exchanger. The set of components also includes a first heat exchanger configured to circulate a cooling liquid and a second heat exchanger configured to maintain a constant temperature of the cooling liquid, wherein the constant temperature is a temperature of the cooling liquid within a threshold distance (e.g., less than ±0.5° C.) from a selected temperature. The second heat exchanger can include a controller configured to monitor the cooling liquid temperature and adjust a flow rate of a second cooling component in response to determining that the temperature is outside the threshold distance. The enclosure can include sealing components for isolating the set of components from an external environment. The electronic devices can be mounted on first and second racks. In some embodiments, the devices on the first rack do not dissipate the same amount of heat as the devices on the second rack. The airflow moving components can include at least one fan.

Further embodiments are directed to an article of manufacture that includes a set of components in an enclosure. The set of components includes electronic devices and airflow moving components configured to maintain airflow across the electronic devices from a front plenum of the enclosure to a rear plenum of the enclosure and direct air from the rear plenum through the first heat exchanger. The set of components also includes a first heat exchanger configured to circulate a cooling liquid and a second heat exchanger configured to maintain a constant temperature of the cooling liquid, wherein the constant temperature is a temperature of the cooling liquid within a threshold distance (e.g., less than ±0.5° C.) from a selected temperature. The second heat exchanger can include a controller configured to monitor the cooling liquid temperature and adjust a flow rate of a second cooling component in response to determining that the temperature is outside the threshold distance. The enclosure can include sealing components for isolating the set of components from an external environment. The electronic devices can be mounted on first and second racks. In some embodiments, the devices on the first rack do not dissipate the same amount of heat as the devices on the second rack. The airflow moving components can include at least one fan.

Additional embodiments are directed to a method, which includes enclosing electronic devices and a first heat exchanger in an enclosure and maintaining airflow across the electronic devices from a front to a rear plenum of the enclosure. The method also includes directing air from the rear plenum through the first heat exchanger and circulating a cooling liquid through the first heat exchanger. Further, the method includes maintaining, via a second heat exchanger, a constant temperature of the cooling liquid, wherein the constant temperature is a temperature of the cooling liquid within a threshold distance (e.g., less than ±0.5° C.) from a selected temperature. Airflow moving components can be operated in order to maintain the airflow in some embodiments. The method can also include monitoring the temperature of the cooling liquid at the second heat exchanger; determining that the temperature of the cooling liquid is outside the threshold distance, and in response, adjusting a flow rate of a second cooling liquid circulating through the second heat exchanger. In some embodiments, the method includes mounting sets of the electronic devices on first and second racks. Further, the method can include sealing the enclosure to isolate the electronic devices and first heat exchanger from an external environment. At least one of the electronic devices can be connected to an electronic device in the external environment.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
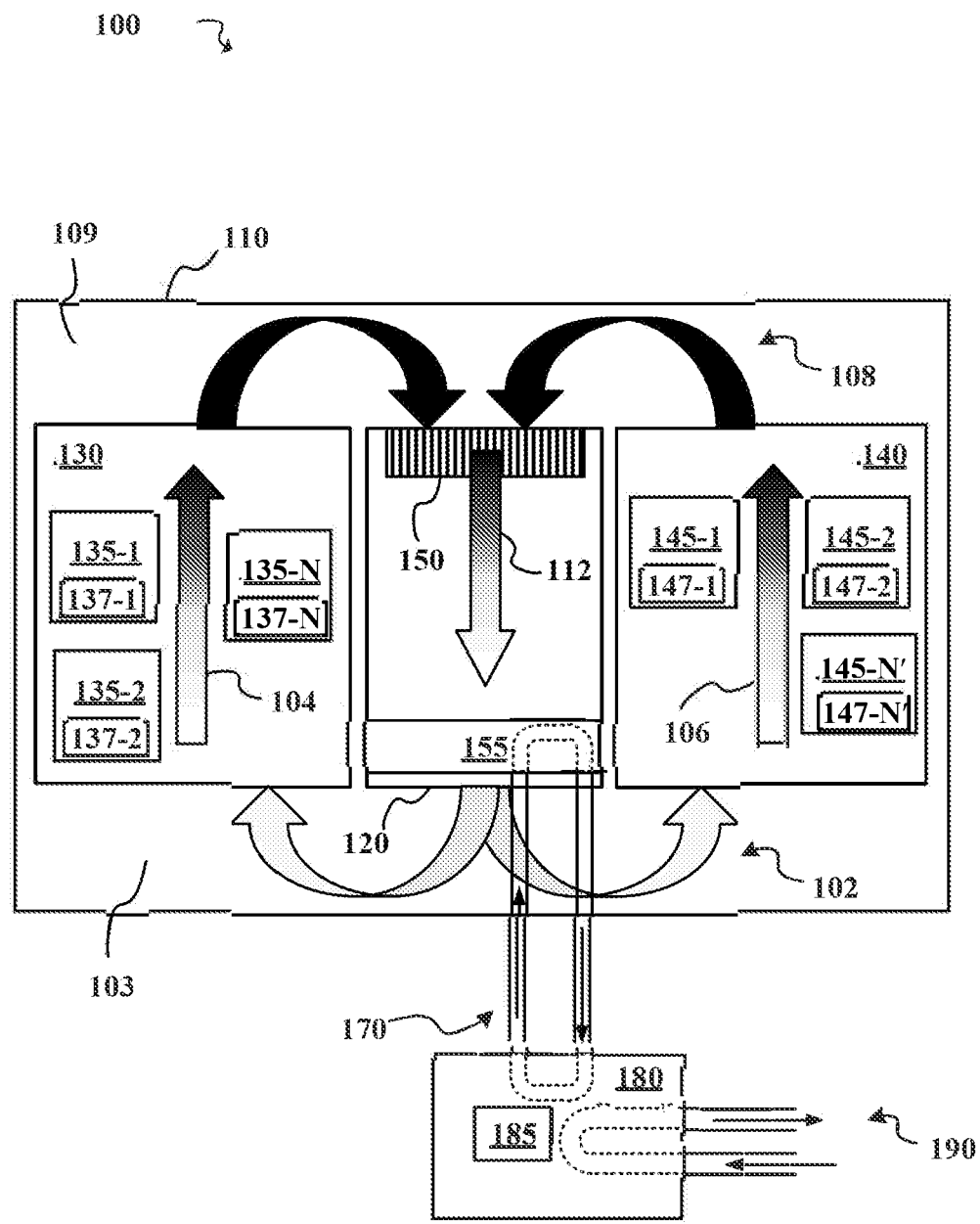
FIG. 1 is a schematic diagram illustrating cooling environment, according to some embodiments of the present disclosure.

While the invention is amenable to various modifications and alternative forms, specifics thereof have been shown by way of example in the drawings, and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Electronic equipment generates heat, which can cause damage to the equipment even when operating within established parameters. This can lead to reduced performance or failure of the electronic equipment. Therefore, cooling systems are used to remove heat generated while operating electronic equipment, such as rack-mounted servers. Closed-loop cooling systems can be used to protect equipment from temperature increases or fluctuations in the surrounding environment. In a closed-loop cooling system, electronic equipment is kept in a sealed enclosure that circulates air, which is cooled by a heat exchanger after absorbing heat from the electronics. The air is then recirculated through the enclosure to absorb newly generated heat.

However, closed-loop systems can experience temperature fluctuations when there is non-homogeneous heat dissipation from enclosed electronic devices. For example, there can be more than one rack in a sealed enclosure. These racks can have different quantities and/or types of electronic devices in different locations, which can dissipate varying amounts of heat. Additionally, more heat can be generated when electronic devices experience an increase in power consumption. These temperature fluctuations can have detrimental effects on electronic equipment. The performance of devices connected to the electronic equipment may also improve when the equipment operates at a stable temperature.

Disclosed herein are techniques for improving temperature consistency in an electronic equipment enclosure using a closed-loop cooling system. Electronic equipment is enclosed in an enclosure that includes a heat exchanger bay. Air circulating through the enclosure absorbs heat dissipated by the equipment while being directed into a rear plenum of the enclosure. An airflow moving component directs the air from the rear plenum into the heat exchanger bay, whereupon the heat is removed by a heat exchanger. In order to minimize temperature fluctuations, the liquid circulating in a closed loop through the heat exchanger passes through an external liquid-to-liquid heat exchanger. Water that flows through the liquid-to-air heat exchanger is controlled to a precise temperature by use of an external heat exchanger. This allows the first heat exchanger to maintain a stable air temperature within the enclosure (e.g., within a threshold of about ±0.1° C.).

FIG. 1 is a schematic diagram illustrating a cooling system 100, according to some embodiments of the present disclosure. As will be understood by persons of ordinary skill in the art, the shapes and sizes of the components in FIG. 1 are for illustrative purposes, and it should be understood that the components of cooling environment 100 can be any size or shape appropriate for their application. Further, the illustrated components are not drawn to scale. The cooling system 100 can also include various components that are not illustrated herein. This is discussed in greater detail below.

The cooling system 100 includes an enclosure 110 suitable for maintaining a closed-loop cooling system. The enclosure 110 isolates its enclosed components from the external environment. The enclosure 110 can contain equipment racks 130 and 140 and a heat exchanger bay 120. At least one heat-generating electronic device is mounted on each equipment rack 130 and 140. Rack 130 is illustrated with electronic devices 135-1, 135-2, and 135-N (collectively 135), and rack 140 is illustrated with electronic devices 145-1, 145-2, 145-N' (collectively 145), where N and N' can each independently be zero or an integer greater than zero. In other embodiments, one or more racks in the enclosure 110 can have a single device. Other devices and components (not shown) that do not consume power may also be mounted on the racks 130 and 140.

Each device 135 and 145 can have at least one airflow moving component 137-1, 137-2, and 137-N (collectively 137) and 147-1, 147-2, and 147-N' (collectively 147), respectively. For example, airflow moving components 137 and 147 can be fans. In some embodiments, devices 135 and 145 may not have internal airflow moving components, but the devices may still generate heat. Alternatively, devices 135 and 145 may have internal airflow moving components, but the devices may not generate heat. In some embodiments, there may be airflow moving components external to the devices 135 and 145. For example, the racks 130 and 140 and/or enclosure 110 can include fans and/or blowers for maintaining airflow (not shown). In some embodiments, the fans and/or blower are required to operate at constant speed to maintain a stable temperature within the enclosure 110. Additionally, the heat transfer bay 120 includes at least one air moving component 150 for directing air into a heat exchanger 155 (see below).

While two racks 130 and 140 are illustrated in FIG. 1, there may be more than two racks in the enclosure 110. In other embodiments, there may be only one rack. The racks 130 and 140 may be of the same or different sizes. Rack sizes can include any standard or specialty sized racks appropriate for the enclosure 110 and devices 135 and 145. For example, the racks 130 and 140 can have 19 inch (48.3 cm) wide front panels and heights of at least one rack unit (U), e.g., 42 U. However, racks of different heights and widths can be used, depending upon the types and sizes of devices 135 and 145, number of devices 135 and 145, size of the enclosure 110, etc. Additionally, while examples involving rack-mounted equipment are illustrated herein, other structures for enclosing, securing, and/or supporting electronic equipment may be used (e.g., chassis, cases, or other enclosures). The enclosure 110 can include sealing mechanisms (see below) that substantially prevent entry of air that has not passed through the heat exchanger bay 120. Smoke sources can be used inside the enclosure 110 to determine the effectiveness of the sealing.

Various types of electronic devices 135 and 145 can be mounted on the racks 130 and 140. For example, the racks 130 and 140 can hold computer servers (e.g., in a data center or server room), telecommunications equipment, audio and/or visual production equipment, industrial control system equipment, supercomputers, high-performance computing (HPC) systems, etc. Examples of heat generating components of the devices 135 and 145 can include power supplies, circuit boards, chips, dual in-line memory modules, capacitors, graphics processing units (GPU), memristors, and other components containing one or more integrated circuits (ICs), etc.

Airflow within the enclosure 110, the racks 130 and 140, and the heat exchanger bay 120 is indicated by directional arrows 102, 104, 106, 108, and 112 in FIG. 1. The gray curved arrows 102 represent cooled air exiting the heat exchanger bay 120 through the heat exchanger 155 into a front plenum 103 of the enclosure 110. As the air pressure in the front plenum 103 increases, the cooled air enters the racks 130 and 140. Airflow moving components and sealing mechanisms such as sealing brushes, blanking plates, panels, gaskets, baffles, sealing foams, etc. can be used to ensure that non-cooled air does not flow from the racks 130 and 140 into the front plenum. Similarly, the sealing mechanisms prevent ambient air from entering the enclosure 110. Airflow through the racks 130 and 140 is represented by arrows 104 and 106. Airflow moving components 137 and 147 can draw the cooled air through the racks 130 and 140. As the air flows through the racks 130 and 140, it removes the heat dissipated by the electronic devices 135 and 145.

The black curved arrows 108 represent heated air exiting the racks 130 and 140 into a rear plenum 109 of the enclosure 110. The amount of heat exiting each rack 130 and 140 can be non-homogeneous. For example, each rack 130 and 140 can have a different number of devices 135 and 145 in various locations. Additionally, the devices 135 and 145 can generate differing amounts of heat, which can be dissipated unevenly. This can depend on device features such as size, materials, efficiency, age, construction, power consumption, hours of operation, location within the enclosure 110, etc. However, constant airflow through the enclosure 110 can help maintain a stable temperature within the enclosure 110. This can be facilitated by airflow moving components 137 and 147 at the devices 135 and 145. Further, mixing of the air in the rear plenum 109 can help maintain temperature consistency of air entering the heat exchanger bay 120 despite non-homogeneous heat dissipation at individual racks.

At least one air moving component 150 such as a blower or fan can be used to draw the heated air from the rear plenum 109 of the enclosure 110 into the heat exchanger bay 120. Airflow through the heat exchanger bay 120 is represented by arrow 112. The air flowing through the heat exchanger bay 120 is cooled by a heat exchanger 155 before being released into the front plenum 103 and recirculated (arrows 102, 104, 106, and 108). The heat exchanger 155 can be any appropriate heat exchanger for cooling air in a closed-loop cooling system. For example, the heat exchanger 155 can be an air-to-liquid heat exchanger with copper pipes through which a cooling liquid such as water circulates (see below) and fins that absorb heat from passing air. In some embodiments, the size of the heat exchanger 155 is less than or approximately equal to the sizes of the racks 130 and 140. For example, if the racks 130 and 140 are standard 19 inch racks, the heat exchanger 155 may be less than 19 inches. Similarly, the height of the heat exchanger need not be the same height as the bays 130 and 140. If the height of the heat exchange 155 is less than that of the racks 130 and 140, it should be sufficiently baffled to prevent air from bypassing the heat exchanger 155.

The heat exchanger 155 can use a first cooling liquid 170 (e.g., water) to cool the heated air. This cooling liquid 170 circulates through the first heat exchanger 155 in a closed loop through sealed pipes (e.g., copper pipes). The enclosure 110 can include pipe entry seals through which the cooling liquid 170 pipes can enter. The cooling capacity of the heat exchanger 155 can be high relative to the amount of heat generated by the devices 135 and 145 in order to minimize the effect of heat transfer on the temperature of the cooling liquid 170. The heat exchanger 155 can have a cooling capacity sufficient for cooling the air from the rear plenum 109 to approximately the same temperature as the temperature of the cooling liquid 170 when it entered the heat exchanger 155, e.g., a cooling capacity greater than required for the amount of heat generated by the electronic devices 135 and 145. The cooling capacity can be significantly larger than required (e.g., five to ten times larger). In some embodiments, the electronic devices 135 and 145 may on average dissipate less than approximately 10 kW heat, and the heat exchanger 155 may be able to remove more than approximately 30 kW (e.g., about 30 kW-50 kW).

However, heat transfer in the heat exchanger 155 may cause the temperature of the cooling liquid 170 to rise. That is, the liquid 170 can have a higher temperature when it enters the external heat exchanger 180 than when it entered the enclosure 110 ("inlet temperature") and enclosed heat exchanger 155. However, in some embodiments the temperature of the liquid 170 leaving the enclosure is lower than the inlet temperature. In order to reduce temperature variations in the enclosure 110, the liquid 170 temperature can be adjusted by an external liquid-to-liquid heat exchanger 180 (e.g., a cooling distribution unit (CDU), modular water unit (MWU), or the like). Herein, this heat exchanger 180 is referred to interchangeably as an external heat exchanger, a liquid-to-liquid heat exchanger, and a second heat exchanger. In order for the temperature within the enclosure 110 to be stable, the temperature of the cooling liquid 170 exiting the external heat exchanger 180 is controlled precisely, e.g., ±0.1° C.

The external heat exchanger 180 can use a second cooling liquid 190 circulating through pipes to and from an external source (not shown), such as a facility water supply, to absorb heat from the first cooling liquid 170. In some embodiments, the first and second cooling liquids 170 and 190 have the same composition. For example, both cooling liquids can be water. However, other coolants may be used. For example, the first and second cooling liquids 170 and 190 may be independently selected from water or refrigerants such as hydrocarbon (HC), hydrofluoroolefin (HFO), hydrofluorocarbon (HFC), and chlorofluorocarbon (CFC) liquid refrigerants.

In an illustrative example, if the selected inlet temperature is 30° C., and the temperature of the cooling liquid 170 entering the external heat exchanger is 35° C., the external heat exchanger 180 may absorb an amount of heat sufficient to lower the liquid 170 temperature by about 5° C. (e.g., 5±0.5° C.) so that the inlet liquid temperature remains consistent. The temperature variation can be related to the flow rate of the fluid, the heat generated in the enclosure 110, and the flow impedance of the plumbing in the first heat exchanger 155. Herein, "consistent" refers to a temperature that is maintained within a narrow range (e.g., ±0.1° C., ±0.5° C., ±1° C., or ±5° C.) unless otherwise indicated. For example, the controller 185 can maintain a cooling liquid 170 temperature consistency of about ±0.5° C. in some embodiments.

The controller 185 includes a temperature sensor and a component for adjusting temperature and/or flow rate of the second cooling fluid 190. The temperature sensor and adjusting component are not illustrated in FIG. 1. The controller 185 can be a microcontroller that is configured to direct operations such as identifying data logging intervals, obtaining data (e.g., collecting and recording temperature measurements, etc.), carrying out data analysis, and communicating results of the data analysis. Based on the temperature of the cooling liquid 170 when it reaches the external heat exchanger 180, the controller 185 can adjust the flow rate and/or temperature of the second cooling liquid 190. For example, if the liquid 170 temperature is higher than the inlet temperature, the controller 185 can cause the flow rate of the second cooling fluid 190 to increase, thereby enabling it to absorb the excess heat from the first cooling liquid 170.

Figure 2:
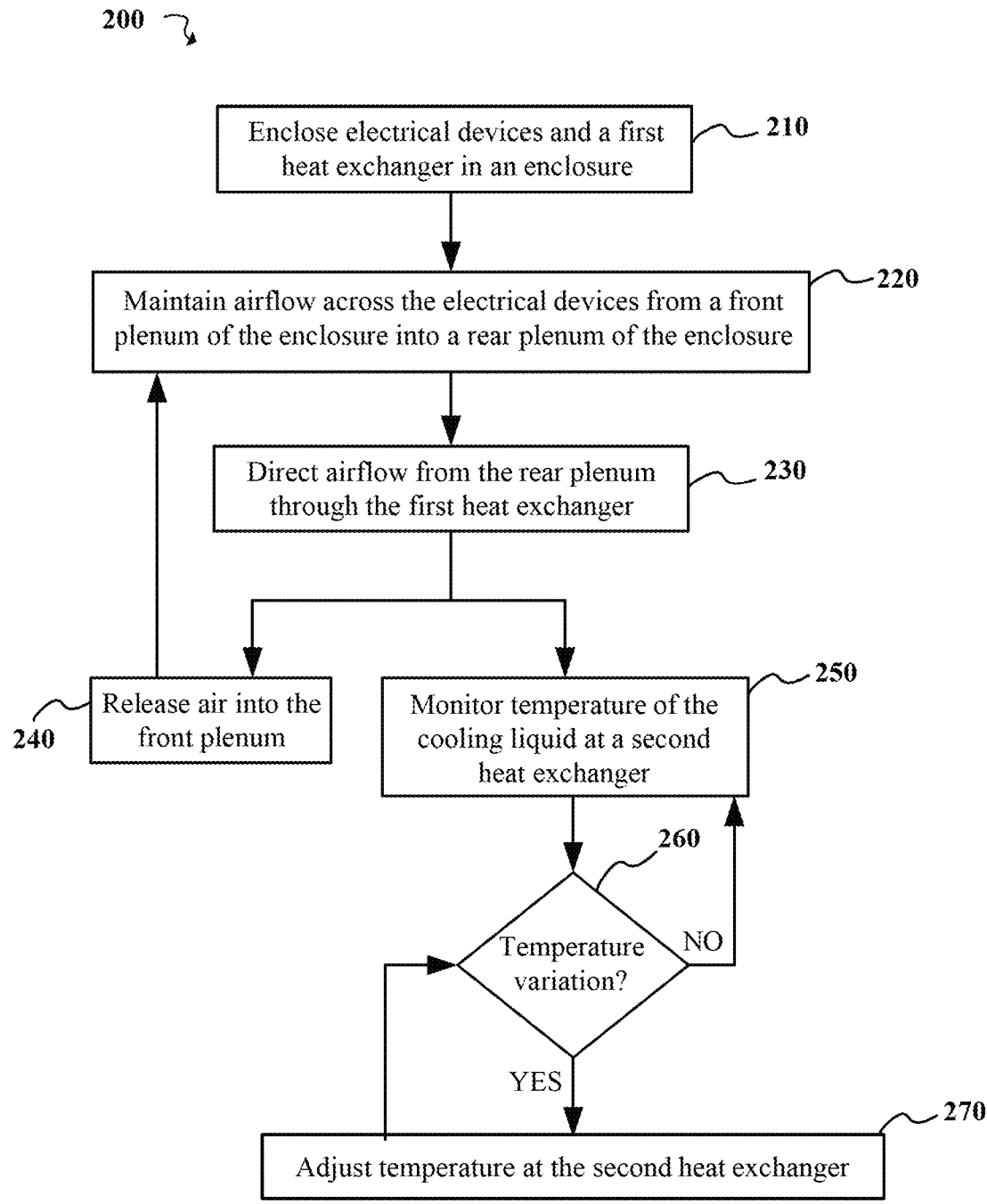
FIG. 2 is a flow diagram illustrating a process of closed-loop cooling, according to some embodiments of the present disclosure.

FIG. 2 is a flow diagram 200 illustrating a process of closed-loop cooling, according to some embodiments of the present disclosure. To illustrate this example, but not to limit embodiments, FIG. 2 is described within the context of the closed-loop cooling system illustrated in FIG. 1. Where elements referred to in FIG. 2 are identical to elements shown in FIG. 1, the same reference numbers are used in each figure.

A first heat exchanger 155 and electronic devices 135 and 145 are enclosed in an enclosure 110. This is illustrated at operation 210. The heat-generating electronic devices 135 and 145 can be mounted on racks 130 and 140 and can have airflow moving components 137 and 147. The enclosure 110 is a sealed enclosure in which air circulates in a closed loop, wherein the environment inside of the enclosure 110 is substantially separated from its external environment. Components such as pipes (e.g., copper pipes for circulation of cooling liquid 170 through the heat exchanger 155) and connectors to power supplies and external devices can enter the enclosure 110 via sealed entrances in order to maintain the closed-loop environment. This is discussed in greater detail with respect to FIG. 1.

Airflow is maintained across the electronic devices 135 and 145 from the front plenum 103 to the rear plenum 109 of the enclosure 110. This is illustrated at operation 220. Airflow moving components (e.g., components 137 and 147) can be used to maintain a substantially constant airflow across the devices 135. Maintaining constant airflow across the devices 135 and 145 can help maintain a constant air temperature in the enclosure 110. The air absorbs heat generated by the devices 135 and 145 and then enters the rear plenum 109. Mixing of air from multiple locations (e.g., racks 130 and 140) in the rear plenum 109 can also facilitate greater air temperature consistency.

The airflow is directed from the rear plenum 109 into the heat exchanger bay 120. This is illustrated at operation 230. The airflow can be directed into the heat exchanger bay 120 by at least one fan 150 or other airflow moving component. This can ensure that substantially all of the air from the rear plenum 109 travels through the heat exchanger 155, which can be an air-to-liquid heat exchanger. Heat dissipated by the electronic devices 135 and 145 is transferred to a cooling liquid 170 circulating in a closed loop (see FIG. 1).

The cooling liquid 170 enters the first heat exchanger 155 at a given temperature ("inlet temperature"). The inlet temperature can be selected based on the requirements of the devices 135 and 145 in the enclosure 110. For example, the temperature can be selected based on the amount of heat expected to be generated by the devices 135 and 145. In some embodiments, the inlet temperature is selected from temperatures between about 5° C. and 35° C. However, other inlet liquid temperatures can be selected (e.g., temperatures between about 5-25° C., 10-20° C., 20-25° C., 35-40° C., 40-55° C., etc.). Heat dissipated by the devices 135 and 145 is transferred to the cooling liquid 170 in the first heat exchanger 155.

The cooled air exits the first heat exchanger 155 into the front plenum 103. This is illustrated at operation 240. This causes the air pressure in the front plenum 103 to increase. Process 200 then returns to operation 220, whereupon the cooled air in the front plenum 103 enters the racks 130 and 140 and crosses the devices 135 and 145 again.

At the same time, the cooling liquid 170 travels to a second heat exchanger 180, which monitors the temperature of the cooling liquid 170. This is illustrated at operation 250. The second heat exchanger 180 is an external liquid-to-liquid heat exchanger that includes a controller 185. The temperature can be monitored by a temperature sensor in the controller 185. The controller 185 can compare the temperature of the cooling liquid 170 entering the second heat exchanger 180 with the preselected inlet temperature. Variations in the amount of heat generated by the electronic devices 135 and 145 can cause temperature variations in the cooling liquid 170.

The controller 185 determines whether there has been a change in the temperature of the cooling liquid 170. This is illustrated at operation 260. For example, a temperature change can be detected when the controller 185 detects a cooling liquid 170 temperature variation greater than a threshold temperature difference (e.g., ±0.1° C., ±0.5° C., ±1° C., ±5° C., etc.) from the inlet temperature. The threshold difference can be preset by a manufacturer or user based on the sensitivity of the devices 135 and 145 to temperature changes. The range can depend on factors such as types of heat exchangers 155 and 180, types of cooling liquids 170 and 190, user preferences (e.g., based on the devices' 135 and 145 tolerance for temperature changes), etc. In some embodiments, the threshold difference can be the narrowest range within the capabilities of the liquid-to-liquid heat exchanger 180.

If a temperature change greater than the threshold variation is not detected at operation 240, process 200 can return to operation 250 to monitor the temperature of the next cooling liquid 170 circulation. However, if a temperature variation greater than the threshold variation is detected at operation 260, the liquid 170 temperature can be adjusted at the second heat exchanger 180. This is illustrated at operation 270. The controller 185 can adjust the flow rate and/or temperature of a second cooling fluid 190 circulating through the second heat exchanger 180 from an external source (e.g., a facility water supply) in order to adjust the temperature of the cooling liquid from the first heat exchanger 170 (e.g., by increasing the flow rate to remove excess heat caused by a temperature increase). The temperature adjustment can return the cooling liquid temperature 170 to a temperature within the threshold variation from the inlet temperature. The consistency of the liquid 170 temperature allows for greater air temperature consistency within the enclosure 110. Process 200 then returns to operation 260.

Herein, room temperature is between about 15° C. and 30° C. unless otherwise indicated. Ranges (e.g., time, concentration, temperature, etc.) indicated herein include both endpoints and all numbers between the endpoints. Unless specified otherwise, the use of "about," "approximately," or a tilde (~) in connection with a range applies to both ends of the range (e.g., "approximately 1 g-5 g" should be interpreted as "approximately 1 g-approximately 5 g"), and in connection with a list of ranges applies to each range in the list (e.g., "about 1 g-5 g, 5 g-10 g, etc." should be interpreted as "about 1 g-about 5 g, about 5 g-about 10 g, etc."). Unless otherwise indicated, modifying terms such as "about," "approximately," and "~" indicate +/−10% of a recited value, range of values, or endpoints of one or more ranges of values.

The processes discussed herein, and their accompanying drawings, are not to be construed as limiting. One skilled in the art would recognize that a variety of techniques may be used that vary in conditions, components, methods, etc., which ultimately result in stabilization of a cooling liquid temperature. In addition, the conditions can optionally be changed over the course of a process. Further, in some embodiments processes can be added, omitted, or carried out in alternate orders, while still remaining within the scope of the disclosure, as will be understood by a person of ordinary skill in the art. It should also be noted that processes can be carried out by a single entity, or by multiple entities.

What is claimed is:

1. A system, comprising:
a closed-loop cooling system comprising an enclosure, the enclosure inside of a data center;
a set of components in the enclosure, the set of components comprising:
at least two equipment racks;
electronic devices mounted on the at least two equipment racks;
a first heat exchanger; and
airflow moving components configured to:
circulate air in a closed loop within the enclosure; and
maintain airflow of the circulating air across the electronic devices, wherein the circulating air travels:

from a front plenum of the enclosure to a rear plenum of the enclosure, crossing the at least two equipment racks, from the rear plenum through the first heat exchanger, and from the first heat exchanger to the front plenum;

a second heat exchanger located outside the enclosure;

a first cooling liquid circulating in a closed loop through the first heat exchanger inside the enclosure and the second heat exchanger outside the enclosure, wherein the first cooling liquid enters the enclosure at an inlet temperature and enters the second heat exchanger from the enclosure at an outlet temperature;

a second cooling liquid from an external source outside the data center circulating through the second heat exchanger; and a controller configured to:
monitor the inlet temperature and the outlet temperature of the first cooling liquid;
determine, based on the monitoring, that a variation between the inlet temperature and the outlet temperature is greater than a threshold variation; and
adjust the flow rate of the second cooling liquid in response to the determining.

2. The system of claim 1, wherein the enclosure is configured to isolate the set of components from an external environment.

3. The system of claim 1, wherein the electronic devices comprise:
a first set of electronic devices mounted on a first rack of the at least two equipment racks; and
a second set of electronic devices mounted on a second rack of the at least two equipment racks.

4. The system of claim 3, wherein a quantity of heat dissipated by the first set of electronic devices is not the same as a quantity of heat dissipated by the second set of electronic devices.

5. The system of claim 1, wherein the threshold variation is less than ±0.5° C.

6. The system of claim 1, wherein the airflow moving components comprise at least one fan.

7. The system of claim 1, wherein the first heat exchanger has a cooling capacity at least five times larger than an amount of heat generated by the electronic devices.

8. The system of claim 1, wherein the threshold variation is ±0.1° C.

9. The system of claim 1, wherein the adjusting the flow rate comprises:
determining that the outlet temperature is lower than the inlet temperature; and
in response to the determining that the outlet temperature is lower than the inlet temperature, decreasing the second flow rate.

10. The system of claim 1, wherein the airflow moving components are configured to maintain the airflow at a constant rate.

11. The system of claim 1, wherein the airflow moving components in the enclosure comprise components external to the electronic devices.

12. An article of manufacture, comprising:
a closed-loop cooling system comprising an enclosure, the enclosure inside a data center;
a set of components in the enclosure, the set of components comprising:
at least two equipment racks;
electronic devices mounted on the at least two equipment racks;
a first heat exchanger; and
airflow moving components configured to:
circulate air in a closed loop within the enclosure; and
maintain airflow of the circulating air across the electronic devices, wherein the circulating air travels:
from a front plenum of the enclosure to a rear plenum of the enclosure, crossing the at least two equipment racks,
from the rear plenum through the first heat exchanger, and
from the first heat exchanger to the front plenum;
a second heat exchanger inside the data center, wherein the second heat exchanger is located outside the enclosure;
a first cooling liquid circulating in a closed loop through the first heat exchanger inside the enclosure and the second heat exchanger outside the enclosure, wherein the first cooling liquid enters the enclosure at an inlet temperature and enters the second heat exchanger from the enclosure at an outlet temperature;
a second cooling liquid from an external source outside the data center circulating through the second heat exchanger; and
a controller configured to:
monitor the inlet temperature and the outlet temperature of the first cooling liquid;
determine, based on the monitoring, that a variation between the inlet temperature and the outlet temperature is greater than a threshold variation; and
adjust the flow rate of the second cooling liquid in response to the determining.

13. The article of manufacture of claim 12, wherein the enclosure is configured to isolate the set of components from an external environment.

14. The article of manufacture of claim 12, wherein the electronic devices comprise:
a first set of electronic devices mounted on a first rack of the at least two equipment racks; and
a second set of electronic devices mounted on a second rack of the at least two equipment racks.

15. The article of manufacture of claim 12, wherein the threshold variation is less than ±0.5° C.

16. The article of manufacture of claim 12, wherein the airflow moving components comprise at least one fan.

17. A method, comprising:
providing a closed-loop cooling system comprising an enclosure, the enclosure inside a data center;
enclosing a set of components in the enclosure, the set of components comprising:
at least two equipment racks;
electronic devices mounted on the at least two equipment racks;
a first heat exchanger; and
airflow moving components;
circulating air in a closed loop through the enclosure;
maintaining, by the airflow components, airflow of the circulating air across the electronic devices, wherein the circulating air travels:
from a front plenum of the enclosure to a rear plenum of the enclosure, crossing the at least two equipment racks,
from the rear plenum through the first heat exchanger, and
from the first heat exchanger to the front plenum;

providing a second heat exchanger located outside the enclosure;

circulating a first cooling liquid in a closed loop through the first heat exchanger inside the enclosure and the second heat exchanger outside the enclosure, wherein the first cooling liquid enters the enclosure at an inlet temperature and enters the second heat exchanger from the enclosure at an outlet temperature;

circulating a second cooling liquid from an external source outside the data center through the second heat exchanger; and monitoring the inlet temperature and the outlet temperature of the first cooling liquid;

determining, based on the monitoring, that a variation between the inlet temperature and the outlet temperature is greater than a threshold variation; and adjusting the flow rate of the second cooling liquid in response to the determining.

18. The method of claim 17, further comprising mounting a first set of the electronic devices on a first rack of the at least two equipment racks and a second set of the electronic devices on a second rack of the at least two equipment racks.

19. The method of claim 17, wherein the threshold variation is less than ±0.5° C.

20. The method of claim 17, further comprising isolating the electronic devices and the first heat exchanger from an external environment.

* * * * *